United States Patent
Ueno et al.

(10) Patent No.: US 7,825,434 B2
(45) Date of Patent: Nov. 2, 2010

(54) NITRIDE SEMICONDUCTOR DEVICE

(75) Inventors: Hiroaki Ueno, Osaka (JP); Manabu Yanagihara, Osaka (JP); Tetsuzo Ueda, Osaka (JP); Yasuhiro Uemoto, Shiga (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/647,218

(22) Filed: Dec. 29, 2006

(65) Prior Publication Data

US 2007/0170463 A1    Jul. 26, 2007

(30) Foreign Application Priority Data

Jan. 25, 2006  (JP) .............................. 2006-016622

(51) Int. Cl.
  *H01L 29/08*   (2006.01)
(52) U.S. Cl. .......................... 257/194; 257/27; 257/192; 257/195; 257/E29.246; 257/E29.247; 257/E29.248; 257/E29.249; 257/E29.25; 257/E29.251; 257/E29.252
(58) Field of Classification Search .................. 257/27, 257/192, 194, 195, E29.246–252
  See application file for complete search history.

(56) References Cited

U.S. PATENT DOCUMENTS

| | | | |
|---|---|---|---|
| 7,038,252 | B2 | 5/2006 | Saito et al. |
| 2004/0238842 | A1* | 12/2004 | Micovic et al. ............. 257/192 |
| 2006/0060871 | A1* | 3/2006 | Beach ......................... 257/94 |
| 2006/0121682 | A1* | 6/2006 | Saxler ......................... 438/312 |
| 2006/0273347 | A1 | 12/2006 | Hikita et al. |
| 2009/0121775 | A1 | 5/2009 | Ueda et al. |

FOREIGN PATENT DOCUMENTS

| | | | |
|---|---|---|---|
| JP | 11-261053 A | | 9/1999 |
| JP | 2004-273486 | * | 9/2004 |

(Continued)

OTHER PUBLICATIONS

Norio Tsuyukuchi et al. "Low Leakage Current Enhancement Mode AlGaN/GaN Heterostructure Field Effect Transistor Using p-Type Gate Contact" Mar. 10, 2006. Japanese Journal of Applied Physics Vol. 45, No. 11.*

(Continued)

*Primary Examiner*—Kiesha R Bryant
*Assistant Examiner*—Minchul Yang
(74) *Attorney, Agent, or Firm*—McDermott Will & Emery LLP

(57) ABSTRACT

A nitride semiconductor device includes: a first semiconductor layer made of first nitride semiconductor; a second semiconductor layer formed on a principal surface of the first semiconductor layer and made of second nitride semiconductor having a bandgap wider than that of the first nitride semiconductor; a control layer selectively formed on, or above, an upper portion of the second semiconductor layer and made of third nitride semiconductor having a p-type conductivity; source and drain electrodes formed on the second semiconductor layer at respective sides of the control layer; a gate electrode formed on the control layer; and a fourth semiconductor layer formed on a surface of the first semiconductor layer opposite to the principal surface, having a potential barrier in a valence band with respect to the first nitride semiconductor and made of fourth nitride semiconductor containing aluminum.

9 Claims, 6 Drawing Sheets

FOREIGN PATENT DOCUMENTS

JP        2004-273486 A        9/2004

OTHER PUBLICATIONS

Masahiro Hikita et al., "350V/150A AlGa/GaN power HFET on Silicon substrate with source-via grounding (SVG) structure," Technical Digest of 2004 International Electron Devices Meeting, 2004 IEEE, p. 803.

O. Ambacher et al., "Two-dimensional electron gases induced by spontaneous and piezoelectric polarization charges in N- and Ga-face AlGaN/GaN heterostructures," Journal of Applied Physics, Mar. 15, 1999, pp. 3222-3233, vol. 85, No. 6, 1999 American Institute of Physics.

L. Zhang et al., "Epitaxially-Grown GaN Junction Field Effect Transistors," IEEE Transactions on Electron Devices, Mar. 2000, pp. 507-511, vol. 47, No. 3, 2000 IEEE.

Uemoto, et al., "A Normally-off AlGaN/GaN Transistor with RonA=2.6mΩcm2 and BVds=640V Using Conductivity Modulation," IEEE 2006.

* cited by examiner

NITRIDE SEMICONDUCTOR DEVICE

CROSS-REFERENCE TO RELATED APPLICATION

The disclosure of Japanese Patent Application No. 2006-016622 filed in Japan on Jan. 25, 2006 including specification, drawings and claims is incorporated herein by reference in its entirety.

BACKGROUND OF THE INVENTION

The present invention relates to nitride semiconductor devices made of Group III-V nitride semiconductor containing gallium nitride (GaN) as a main component and capable of operating at positive voltages (normally-OFF operation).

In recent years, field effect transistors (hereinafter, referred to as FETs) using GaN-based compound semiconductor materials have been intensively studied as radio-frequency (RF) high-power devices. Nitride semiconductor materials such as GaN enable formation of various mixed crystals together with aluminum nitride (AlN) or indium nitride (InN), and thus are capable of forming heterojunctions in the same manner as conventionally-used arsenic-based semiconductor materials containing gallium arsenide (GaAs) as a main component. However, in a heterojunction in nitride semiconductor, high-concentration carriers are generated at the junction by spontaneous polarization or piezoelectric polarization of the nitride semiconductor even in an undoped state. Accordingly, the resultant FET is likely to be of a depletion type (normally-ON type) and it is difficult to obtain characteristics of an enhancement type (normally-ON type). Devices which are currently distributed in the power electronics market are of the normally-OFF type and such normally-OFF type devices are also strongly demanded for GaN-based nitride semiconductor devices.

Hereinafter, a conventional FET using a nitride semiconductor material will be described.

As illustrated in FIG. 7, a conventional FET using a heterojunction between AlGaN and GaN includes: a sapphire substrate 701 having a principal surface whose surface orientation is a (0001) plane; an undoped GaN layer 702 formed on the principal surface of the substrate 701; and an undoped $Al_{0.25}Ga_{0.75}N$ layer 703 formed on the undoped GaN layer 702.

A source electrode 704 and a drain electrode 705 made of titanium (Ti) and aluminum (Al) are formed on the undoped $Al_{0.25}Ga_{0.75}N$ layer 703. A gate electrode 706 made of palladium (Pd) is formed between the source electrode 704 and the drain electrode 705. A passivation film 707 made of silicon nitride (SiN) is formed on portions of the upper surface of the undoped $Al_{0.25}Ga_{0.75}N$ layer 703 where the source electrode 704, the drain electrode 705 and the gate electrode 706 are not formed.

A two-dimensional electron gas layer at a concentration of approximately $1 \times 10^{13}$ cm$^{-2}$ is formed in the heterojunction between the undoped GaN layer 702 and the undoped $Al_{0.25}Ga_{0.75}N$ layer 703 by spontaneous polarization and piezoelectric polarization of the undoped $Al_{0.25}Ga_{0.75}N$ layer 703.

This formation is explained from distributions of fixed charge and free electrons generated by polarization in the conventional FET, as shown in FIG. 8. Specifically, negative fixed charge is generated in each of the upper surfaces of the undoped GaN layer 702 and the undoped $Al_{0.25}Ga_{0.75}N$ layer 703, whereas positive fixed charge is generated in each of the lower surfaces thereof. In FIG. 8, fixed charge generated in the undoped $Al_{0.25}Ga_{0.75}N$ layer 703 is indicated by the solid lines and fixed charge generated in the undoped GaN layer 702 is indicated by the broken lines. As shown in FIG. 8, the amount of fixed charge generated in the undoped $Al_{0.25}Ga_{0.75}N$ layer 703 is larger than that of fixed charge generated in the undoped GaN layer 702, so that sheet carriers in an amount enough to compensate for the difference in fixed charge amount is formed in the form of a two-dimensional electron gas layer in the heterojunction (indicated by the bold line $N_s$ in FIG. 8).

This polarization causes an electric field in the undoped GaN layer 702 and the undoped $Al_{0.25}Ga_{0.75}N$ layer 703, so that the energy band of the conventional FET is in the state shown in FIG. 9. Accordingly, as shown in FIG. 10, electrical characteristics of a gate voltage and drain current basically exhibit normally-ON characteristics.

The source electrode 704 and the drain electrode 705 are in contact with the undoped $Al_{0.25}Ga_{0.75}N$ layer 703. However, if the thickness of the undoped $Al_{0.25}Ga_{0.75}N$ layer 703 is small, e.g., 30 nm or less, the source electrode 704 and the drain electrode 705 are allowed to be connected to a high-concentration two-dimensional electron gas layer formed in the heterojunction by tunnel current and thus have excellent Ohmic contacts. The gate electrode 706 has a high work function of 5.1 eV, and has an excellent Schottky junction with the undoped $Al_{0.25}Ga_{0.75}N$ layer 703 (see M. Hikita et al., Technical Digest of 2004 International Electron Devices Meeting (2004) p. 803).

In this manner, to achieve normally-OFF operation characteristics using a GaN-based compound semiconductor material which is likely to be of a normally-ON type, it is necessary to reduce the amount of carriers generated in channel by spontaneous polarization and piezoelectric polarization of a GaN-based nitride semiconductor material. In the case of a conventional FET using a heterojunction between an AlGaN layer and a GaN layer, if the Al content in the AlGaN layer is reduced, stress due to the lattice constant difference between the AlGaN layer and the GaN layer is reduced, so that piezoelectric polarization decreases and, as a result, the sheet carrier concentration is allowed to be reduced (see O. Ambacher et al., J. Appl. Phys. Vol. 85 (1999) p. 3222).

Specifically, when the Al content is reduced from 0.25 to 0.15 with the thickness of the undoped $Al_{0.25}Ga_{0.75}N$ layer 703 in FIG. 7 kept at 30 nm, the sheet carrier concentration is greatly reduced from $1.2 \times 10^{13}$ cm$^{-2}$ to $5 \times 10^{12}$ cm$^{-2}$. However, not only the reduction of the sheet carrier concentration reduces operation current, but also the reduction of the Al content of the undoped $Al_{0.25}Ga_{0.75}N$ layer 703 reduces the potential barrier in the gate. In addition, since occurrence of leakage current at the gate electrode needs to be suppressed, the upper limit is set for a forward voltage applicable to the gate electrode 706.

Accordingly, as a method for allowing application of a higher forward voltage in a normally-OFF type device, the gate is formed as a p-type region so as to enhance the potential barrier. FETs having such characteristics are junction field effect transistors (hereinafter, referred to as JFETs) (see L. Zhang et al., IEEE Transactions on Electron Devices, vol. 47, no. 3, pp. 507-511, 2000 and Japanese Unexamined Patent Publication No. 2004-273486).

However, if a JFET is of a normally-OFF type, it is difficult to previously increase the concentration of electrons generated in channel even by applying a forward bias to the gate electrode. In addition, a forward bias is allowed to be applied to the gate electrode until current starts flowing from the gate, and more specifically, the limit is about 3 V in consideration of a bandgap. Therefore, a conventional JFET has the problem of difficulty in increasing drain operation current.

FIG. 11 is a cross-sectional view of a nitride semiconductor device as a comparative example for solving the problem described above.

As illustrated in FIG. 11, the nitride semiconductor device as a comparative example for solving conventional problems includes: a sapphire substrate 901 having a principal surface whose surface orientation is a (0001) plane; an AlN buffer layer 902 formed on the principal surface of the substrate 901; an undoped GaN layer 903 formed on the AlN buffer layer 902; an undoped AlGaN layer 904 formed on the undoped GaN layer 903; a p-type control layer 905 formed on a portion of the undoped AlGaN layer 904 and made of AlGaN containing a p-type impurity; and a p-type contact layer 906 formed on the p-type control layer 905 and made of GaN containing a p-type impurity at a concentration higher than that of the p-type control layer 905.

The nitride semiconductor device further includes: a gate electrode 907 formed on the p-type contact layer 906 to be in Ohmic contact with the p-type contact layer 906; a source electrode 908 and a drain electrode 909 formed on the undoped AlGaN layer 904 to sandwich the p-type contact layer 906 therebetween; and a passivation film 910 formed on the region of the upper surface of the undoped AlGaN layer 904 except for regions where the gate electrode 907, the source electrode 908 and the drain electrode 909 are formed.

In this nitride semiconductor device, the bandgap of the undoped AlGaN layer 904 is wider than that of the undoped GaN layer 903 serving as a channel region. The undoped AlGaN layer 904 and the p-type control layer 905 are made of an identical material, so that the bandgap of the p-type control layer 905 forming a p-type control region is also wider than that of the undoped GaN layer 903. In addition, a heterobarrier is formed at the interface between the undoped GaN layer 903 and the undoped AlGaN layer 904, and a two-dimensional electron gas layer is formed during operation of the semiconductor device.

In this manner, the p-type control region (i.e., the p-type control layer 905) having a wide bandgap is provided above the channel region (i.e., the undoped GaN layer 903) of nitride semiconductor and the p-type control region is forward biased with respect to the channel region, so that holes are injected into the channel region. This causes electrons in the same amount as the holes to be generated in the channel region, thus obtaining large operation current. With this structure, holes injected into the channel region facilitate generation of electrons in the channel region, thus making it possible to greatly increase the amount of current flowing in the channel region.

In addition, the mobility of holes in nitride semiconductor is much smaller than that of electrons, so that holes injected into the channel region of nitride semiconductor hardly serves as a single unit for causing current to flow. Accordingly, holes injected from the p-type control region are capable of generating the same amount of electrons in the channel region and increasing operating current. As the mobility of holes injected into the channel region approaches zero, the holes serve as donor ions, so that modulation of carrier concentration is enabled in the channel region. As a result, a normally-OFF nitride semiconductor device having large operation current is implemented.

This structure is similar to that of JFETs, but is completely different from the operation principle of a JFET in which the carrier concentration in the channel region is modulated at the junction of the gate electrode because carrier implantation is intentionally performed.

The nitride semiconductor device structure of the comparative example described above has a problem in which when holes are injected from the p-type control region into the channel region, the holes cannot remain in the channel region and flow downward so that the amount of holes which effectively function in the channel region decreases. In addition, the switching speed depends on the recombination speed between holes and electrons, so that the switching speed needs to be increased to increase operation current.

SUMMARY OF THE INVENTION

It is therefore an object of the present invention to provide a normally-OFF nitride semiconductor device in which operation current is allowed to be increased.

To achieve the object, the nitride semiconductor device of the present invention has a structure in which a semiconductor layer made of a nitride semiconductor material having a potential barrier in the valence band with respect to a channel region is provided under a semiconductor layer including the channel region.

Specifically, a nitride semiconductor device according to the present invention includes: a first semiconductor layer made of first nitride semiconductor; a second semiconductor layer formed on a principal surface of the first semiconductor layer and made of second nitride semiconductor having a bandgap wider than that of the first nitride semiconductor; a control layer selectively formed on, or above, an upper portion of the second semiconductor layer and made of third nitride semiconductor having a p-type conductivity; source and drain electrodes formed on the second semiconductor layer at respective sides of the control layer; a gate electrode formed on the control layer; and a fourth semiconductor layer formed on a surface of the first semiconductor layer opposite to the principal surface, having a potential barrier in a valence band with respect to the first nitride semiconductor and made of fourth nitride semiconductor containing aluminum.

In the nitride semiconductor device of the present invention, the fourth semiconductor layer made of nitride semiconductor having a potential barrier in the valence band with respect to the first semiconductor layer is provided under the first semiconductor layer. Accordingly, when the control layer is forward biased with respect to the first semiconductor layer, holes injected into the first semiconductor layer effectively contribute to an electron concentration increase in the first semiconductor layer without dissipation. As a result, a normally-OFF nitride semiconductor device with increased operation current is implemented.

It is preferable that upon application of a forward bias to the gate electrode, holes are injected into a channel region formed in the first semiconductor layer and the control layer controls electrical conductivity between the source electrode and the drain electrode.

In the nitride semiconductor device of the present invention, the fourth semiconductor layer preferably has an aluminum content in the range from 0.03 to 0.1, both inclusive.

With this structure, a nitride semiconductor device having larger operation current is implemented. When the Al content is too small, the potential barrier in the valence band does not function, so that holes cannot remain in the first semiconductor layer. On the other hand, if the Al content is too large, polarization difference from the first semiconductor layer increases and the energy band of the first semiconductor layer becomes wider, so that electrons are less likely to be accumulated in the first semiconductor layer. Accordingly, to increase operation current of the nitride semiconductor device, the Al content of a semiconductor material forming the fourth semiconductor layer needs to be set at an appropriate value. Then, a normally-OFF nitride semiconductor device having increased operation current is implemented.

In the nitride semiconductor device of the present invention, the first nitride semiconductor preferably contains indium.

With this structure, the first semiconductor layer contains indium (In), so that the bandgap of the first semiconductor layer becomes narrower, thus further facilitating accumulation of holes injected into the first semiconductor layer and generation of electrons in the first semiconductor layer. Accordingly, a normally-OFF nitride semiconductor device in which a larger amount of operation current is allowed to flow is implemented.

In the nitride semiconductor device of the present invention, the first semiconductor layer preferably has a thickness larger than 0 nm and equal to or smaller than 30 nm.

With this structure, switching is performed at high speed in the nitride semiconductor device of the present invention. If the thickness of the first semiconductor layer is large, the distance between regions where holes and electrons, respectively, are accumulated increases, so that the time constant of recombination increases. In this case, high-speed switching operation cannot be performed. Therefore, it is necessary to appropriately set the thickness of the first semiconductor layer.

According to the present invention, a normally-OFF nitride semiconductor device in which operation current is allowed to be increased is implemented.

DETAILED DESCRIPTION OF THE INVENTION

Hereinafter, embodiments of the present invention will be described with reference to the drawings.

Embodiment 1

Figure 1:
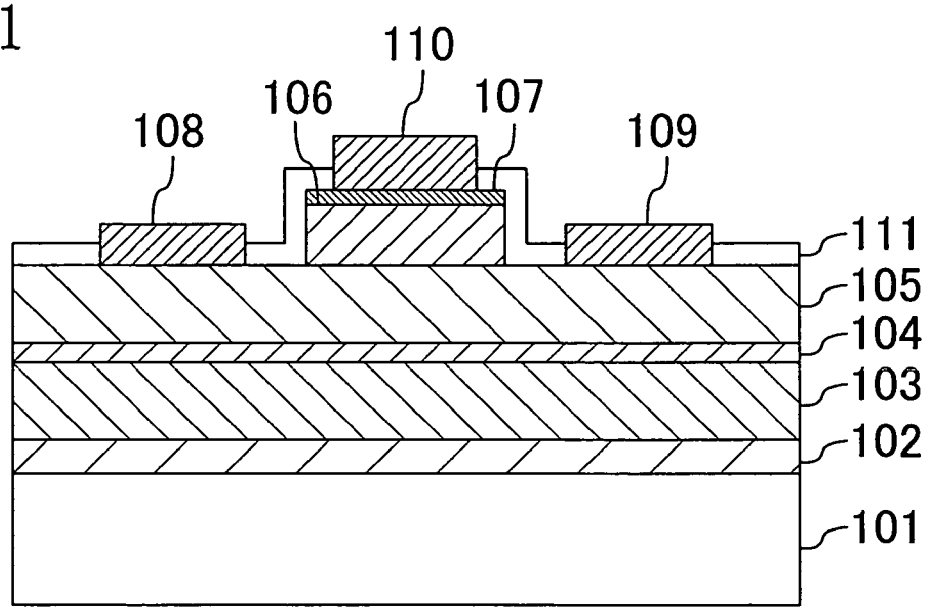
FIG. 1 is a cross-sectional view illustrating a nitride semiconductor device according to a first embodiment of the present invention.

FIG. 1 illustrates an example of a cross-sectional structure of a nitride semiconductor device according to a first embodiment of the present invention.

As illustrated in FIG. 1, a transistor which is the nitride semiconductor device of this embodiment includes: a sapphire ($Al_2O_3$) substrate 101 having a principal surface whose surface orientation is a (0001) plane; a AlN buffer layer 102 formed on the substrate 101 and having a thickness of 100 nm; an underlying layer 103 formed on the buffer layer 102, having a thickness of 1 μm and made of undoped $Al_xGa_{1-x}N$ (where $0<x\leqq1$); a first semiconductor layer 104 formed on the underlying layer 103, having a thickness of 3.5 nm and made of undoped GaN; a second semiconductor layer 105 formed on the first semiconductor layer 104, having a thickness of 25 nm and made of undoped $Al_{0.15}Ga_{0.85}N$; a control layer 106 formed on the second semiconductor layer 105, having a thickness of 100 nm and made of p-type $Al_{0.15}Ga_{0.85}N$; and a contact layer 107 formed on the control layer 106, having a thickness of 5 nm and made of high-concentration p-type GaN.

The contact layer 107 and the control layer 106 are selectively etched, thereby forming a control region out of the control layer 106 and the contact layer 107 and also forming a source electrode 108 and a drain electrode 109 made of Ti and Al on the second semiconductor layer 105 at respective sides of the control region. A gate electrode 110 of nickel (Ni) is formed on the contact layer 107. Portions of the upper surface where the source electrode 108, the drain electrode 109 and the gate electrode 110 are not formed are covered with a passivation film 111 made of SiN. A high-resistance layer may be formed as an isolation region by implanting ions such as boron (B).

The control layer 106 is doped with magnesium (Mg) at a concentration of about $1\times10^{19}$ $cm^{-3}$ and the carrier concentration thereof is about $1\times10^{18}$ $cm^{-3}$. The contact layer 107 is doped with Mg at a concentration of about $1\times10^{20}$ $cm^{-3}$. When viewed from the upper surface of the substrate 101, the control layer 106 and the contact layer 107 are etched into the shape of stripes each having a width of, for example, 1.5 μm. The gate electrode 110 having a width of 1 μm is formed thereon.

In the nitride semiconductor device of this embodiment, the bandgap of the second semiconductor layer 105 is wider than that of the first semiconductor layer 104. The second semiconductor layer 105 and the control layer 106 are made of an identical material, so that the bandgap of the control layer 106 is also wider than that of the first semiconductor layer 104. In this case, a heterobarrier is formed at the interface between the first semiconductor layer 104 and the second semiconductor layer 105. During operation of the nitride semiconductor device of this embodiment, a channel region made of a two-dimensional electron gas layer is formed in the first semiconductor layer 104 near the interface between the first semiconductor layer 104 and the second semiconductor layer 105.

In a structure in which the second semiconductor layer 105 having a wide bandgap is formed on the upper surface of the first semiconductor layer 104 including the channel region and the underlying layer 103 having a potential barrier in the valence band with respect to the channel region is formed on the lower surface of the first semiconductor layer 104, when the control layer 106 is forward biased with respect to the channel region, holes are injected into the channel region formed in the first semiconductor layer 104 and the injected holes effectively contribute to an increase of the electron concentration in the first semiconductor layer 104 without dissipation.

To obtain a sufficiently-high drain breakdown voltage, the distance between the control layer 106 and the drain electrode 109 illustrated in FIG. 1 is about 5 μm or more. As described for the conventional example, the source electrode 108 and the drain electrode 109 are in contact with the second semiconductor layer 105 and are connected to the two-dimensional electron gas layer formed at the heterojunction between the second semiconductor layer 105 and the first semiconductor layer 104 through tunnel current, so that an excellent Ohmic contact is established. In this embodiment, to achieve a better Ohmic contact, silicon (Si) as an n-type impurity may be selectively diffused in portions of the second semiconductor layer 105 under the source electrode 108 and the drain electrode 109.

Figure 2:
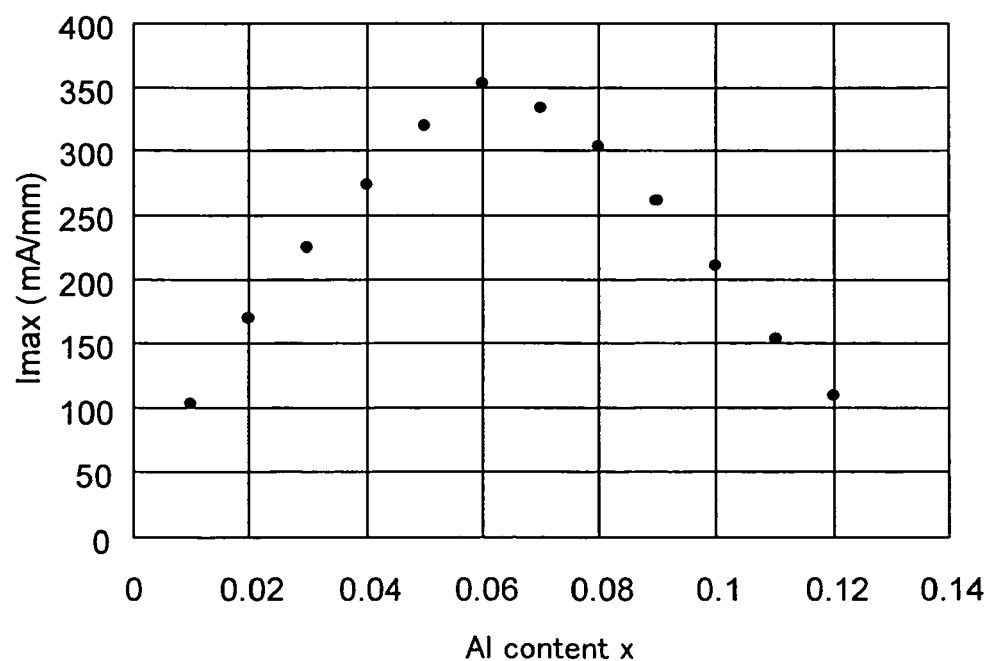
FIG. 2 is a graph showing a relationship between the Al content x of an undoped $Al_xGa_{1-x}N$ underlying layer and the maximum current value in the nitride semiconductor device of the first embodiment.

FIG. 2 shows a relationship (simulation values) of the maximum drain current value with respect to the content x of Al forming the underlying layer 103 in the nitride semiconductor device of the first embodiment.

As shown in FIG. 2, the content x of Al forming the underlying layer 103 is at the maximum around 0.06, and the maximum drain current value of the nitride semiconductor device is small when x is too small and too large.

As described above, in the nitride semiconductor device of this embodiment, the underlying layer 103 made of a semiconductor material having a potential barrier in the valence band with respect to the channel region (i.e., the first semiconductor layer 104) is provided and the content x of Al forming the underlying layer 103 is set in the range from 0.03 to 0.1, both inclusive. Accordingly, a large maximum drain current value of the nitride semiconductor device is obtained.

In this embodiment, sapphire is used as a material of the substrate 101. Instead of sapphire, the substrate may be made of a material such as silicon carbide (SiC), GaN or Si and the surface orientation of the substrate may be in any direction as long as excellent crystallinity is obtained. The gate electrode 110 is not necessarily made of Ni and may be made of a metal of, for example, Pd as long as an excellent Ohmic contact with the contact layer 107 is established. In this embodiment, the control layer 106 and the second semiconductor layer 105 have the same Al content, but may have different Al contents. For example, p-type GaN may be used for the control layer.

In this manner, in the transistor which is a nitride semiconductor device according to this embodiment, the underlying layer 103 having a potential barrier in the valence band with respect to the first semiconductor layer as the channel layer is formed under the first semiconductor layer and the content of Al forming the underlying layer 103 is set at an appropriate value. Accordingly, drain current is caused to flow only by the hole injection described above in a normally-OFF type device and large operation current is achieved by facilitating confinement of holes in the channel.

Embodiment 2

Figure 3:
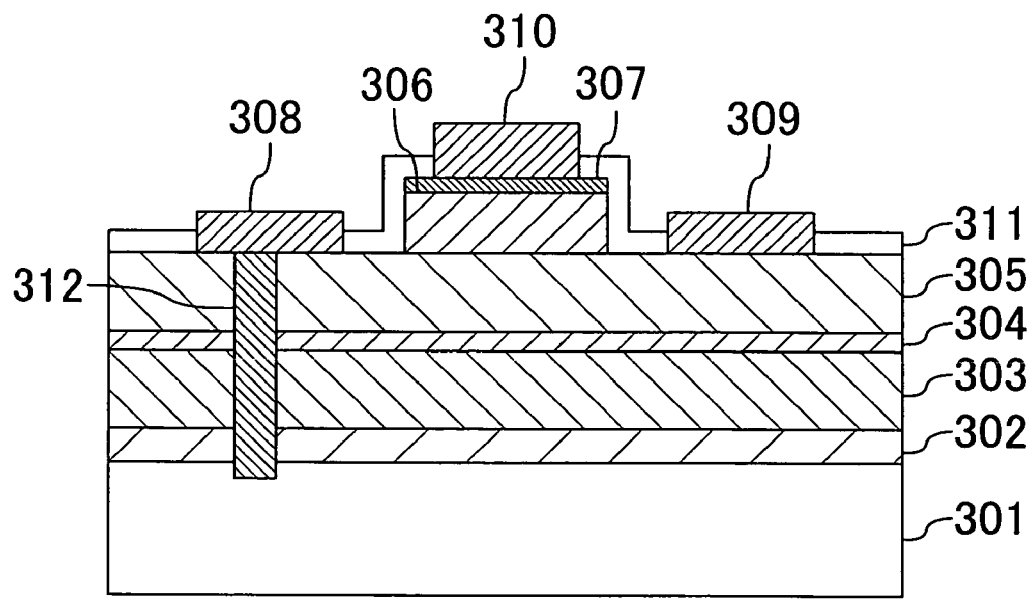
FIG. 3 is a cross-sectional view illustrating a nitride semiconductor device according to a second embodiment of the present invention.

FIG. 3 illustrates an example of a cross-sectional structure of a nitride semiconductor device according to a second embodiment of the present invention.

As illustrated in FIG. 3, a transistor which is the nitride semiconductor device of this embodiment includes: an n-type Si substrate 301 having a principal surface whose surface orientation is a (111) plane; a buffer layer 302 formed on the substrate 301, having a thickness of 40 nm and made of AlN; an underlying layer 303 formed on the buffer layer 302, having a thickness of 1 μm and made of undoped $Al_{0.05}Ga_{0.95}N$; a first semiconductor layer 304 formed on the underlying layer 303, having a thickness of 3.5 nm and made of undoped $In_yGa_{1-y}N$ (where $0<y\leq 1$); a second semiconductor layer 305 formed on the first semiconductor layer 304, having a thickness of 25 nm and made of undoped $Al_{0.15}Ga_{0.85}N$; a control layer 306 formed on the second semiconductor layer 305, having a thickness of 100 nm and made of p-type $Al_{0.15}Ga_{0.85}N$; and a contact layer 307 formed on the control layer 306, having a thickness of 5 nm and made of high-concentration p-type GaN.

The contact layer 307 and the control layer 306 are selectively etched, thereby forming a control region out of the control layer 306 and the contact layer 307 and also forming a source electrode 308 and a drain electrode 309 made of Ti and Al, respectively, on the second semiconductor layer 305 at respective sides of the control region. A gate electrode 310 made of Ni is formed on the contact layer 307. Portions of the upper surface where the source electrode 308, the drain electrode 309 and the gate electrode 310 are not formed are covered with a passivation film 311 made of SiN. To reduce interconnection resistance of the electrode except for the control region, the source electrode 308 has a source via structure connected to the substrate 301 through a via 312.

As in the first embodiment, in the nitride semiconductor device of the second embodiment, the underlying layer 303 has a potential barrier in the valence band with respect to the first semiconductor layer 304, so that the bandgap of the control region is wider than that of the channel region.

Figure 4:
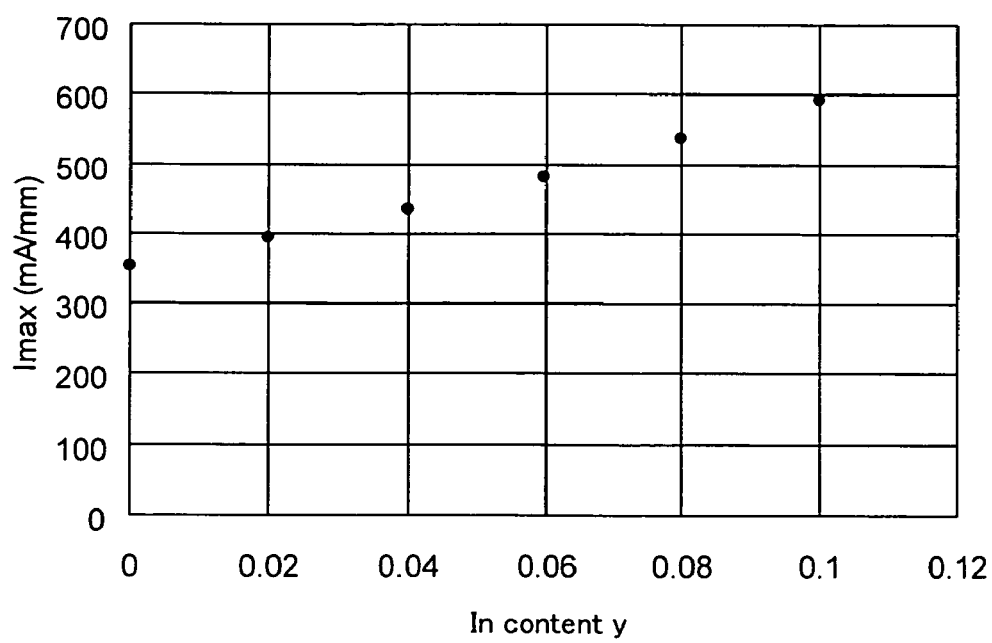
FIG. 4 is a graph showing a relationship between the In content y of an undoped $In_yGa_{1-y}N$ layer and the maximum current value in the nitride semiconductor device of the second embodiment.

FIG. 4 shows a relationship between the content y of In forming the first semiconductor layer 304 and the maximum drain current characteristics (simulation values) in the nitride semiconductor device of the second embodiment.

As shown in FIG. 4, as the content y of In forming the first semiconductor layer 304 increases, the maximum drain current value of the nitride semiconductor device increases.

As described above, the nitride semiconductor device of this embodiment has a structure in which the underlying layer 303 made of a semiconductor material having a potential barrier in the valence band with respect to the first semiconductor layer 304 is provided and the first semiconductor layer 304 contains In. Accordingly, the bandgap of the channel region is reduced and large amounts of electrons and holes are allowed to be accumulated in the channel region. In addition, the channel region has a large In content y, so that a larger maximum drain current value is obtained.

Embodiment 3

Figure 5:
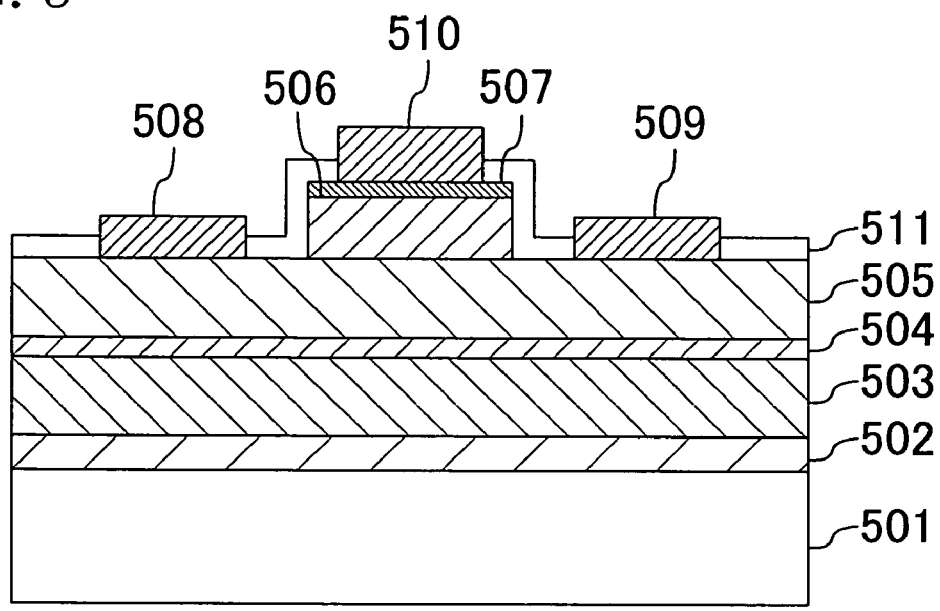
FIG. 5 is a cross-sectional view illustrating a nitride semiconductor device according to a third embodiment of the present invention.

FIG. 5 illustrates an example of a cross-sectional structure of a nitride semiconductor device according to a third embodiment of the present invention.

As illustrated in FIG. 5, a transistor which is the nitride semiconductor device of this embodiment includes: a sapphire substrate 501 having a principal surface whose surface orientation is a (0001) plane; a buffer layer 502 formed on the substrate 501, having a thickness of 100 nm and made of AlN; an underlying layer 503 formed on the buffer layer 502, having a thickness of 1 μm and made of undoped $Al_{0.05}Ga_{0.95}N$; a first semiconductor layer 504 formed on the underlying layer 503, having a thickness of 3.5 nm and made of undoped GaN; a second semiconductor layer 505 formed on the first semiconductor layer 504, having a thickness of 25 nm and made of undoped $Al_{0.15}Ga_{0.85}N$; a control layer 506 formed on the second semiconductor layer 505, having a thickness of 100 nm and made of p-type $Al_{0.15}Ga_{0.85}N$; and a contact layer 507 formed on the control layer 506, having a thickness of 5 nm and made of high-concentration p-type GaN.

The contact layer 507 and the control layer 506 are selectively etched, thereby forming a control region out of the control layer 506 and the contact layer 507 and also forming a source electrode 508 and a drain electrode 509 made of Ti and Al, respectively, on the second semiconductor layer 505 at respective sides of the control region. A gate electrode 510 made of Ni is formed on the contact layer 507. Portions of the upper surface where the source electrode 508, the drain electrode 509 and the gate electrode 510 are not formed are covered with a passivation film 511 made of SiN.

As in the first embodiment, in the nitride semiconductor device of the third embodiment, the underlying layer 503 has a potential barrier in the valence band with respect to the first semiconductor layer 504, so that the bandgap of the control region is wider than that of the first semiconductor layer 504.

Figure 6:
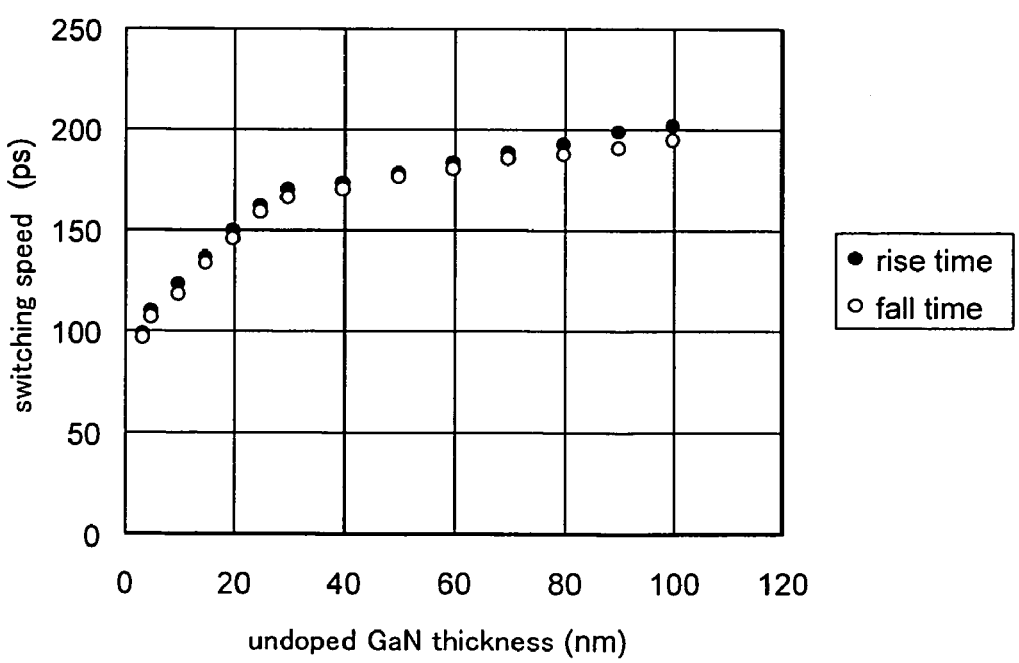
FIG. 6 is a graph showing a relationship between an undoped GaN layer and the switching speed in the nitride semiconductor device of the third embodiment.
Figure 7:
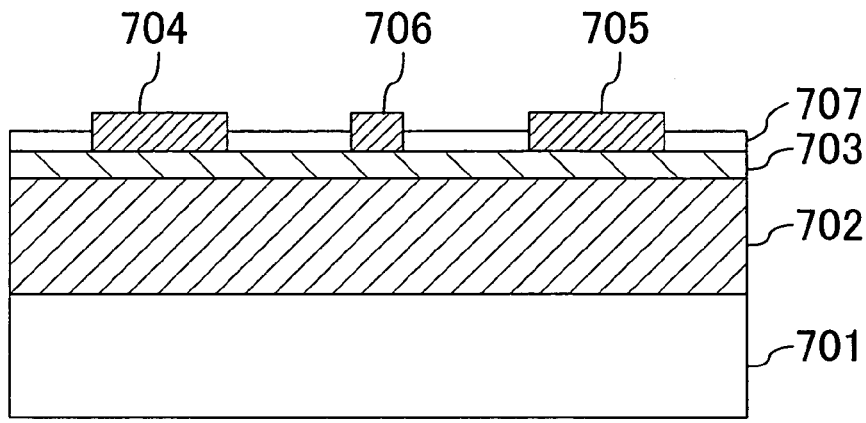
FIG. 7 is a cross-sectional view illustrating a conventional nitride semiconductor FET.
Figure 8:
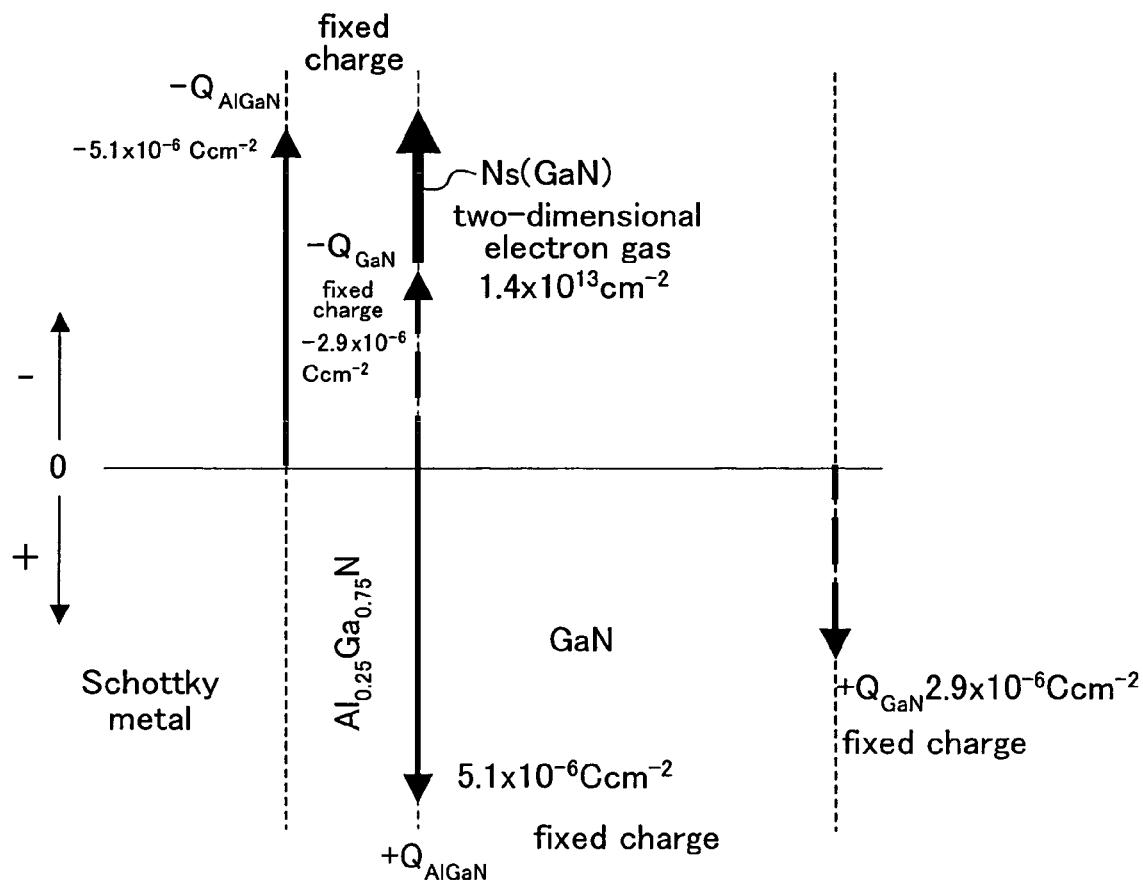
FIG. 8 is a diagram showing distributions of fixed charge and free electrons generated by polarization in the conventional nitride semiconductor FET.
Figure 9:
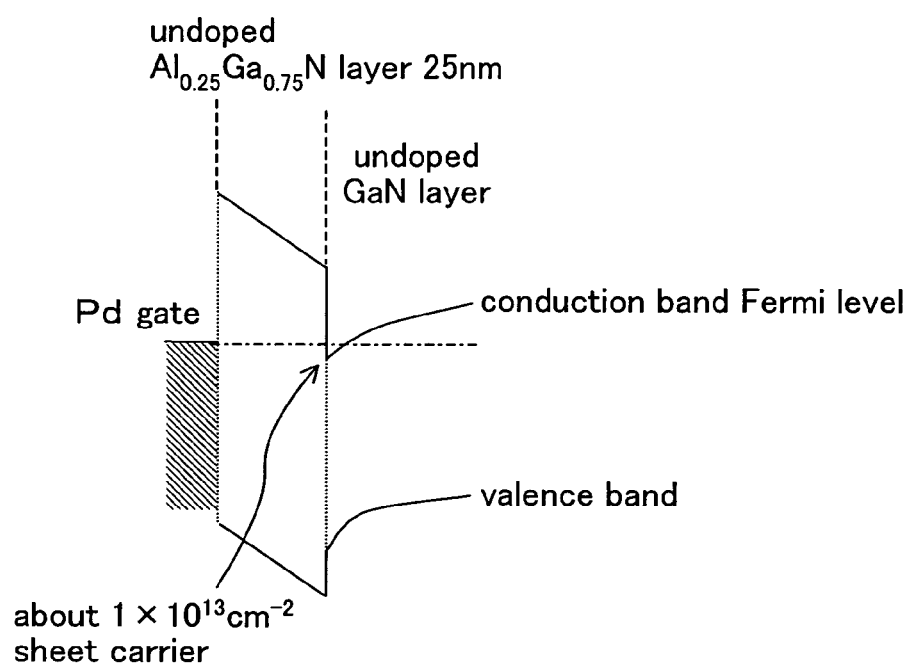
FIG. 9 is a diagram showing an energy band of the conventional nitride semiconductor FET.
Figure 10:
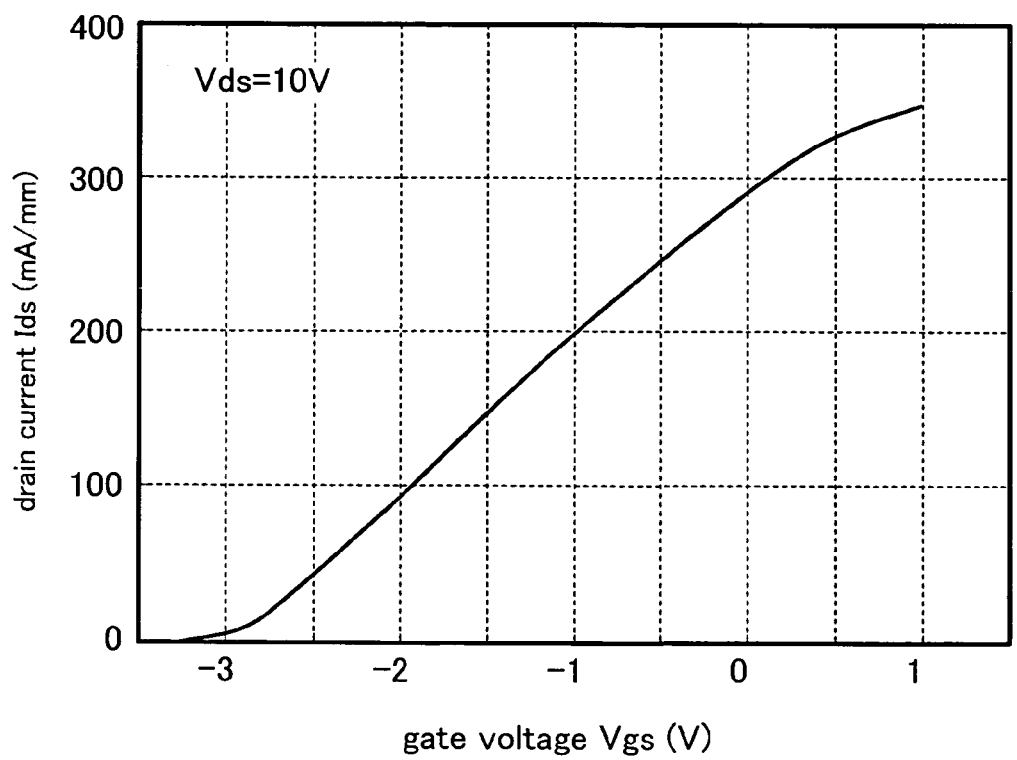
FIG. 10 is a graph showing drain current-drain voltage characteristics of the conventional nitride semiconductor FET.
Figure 11:
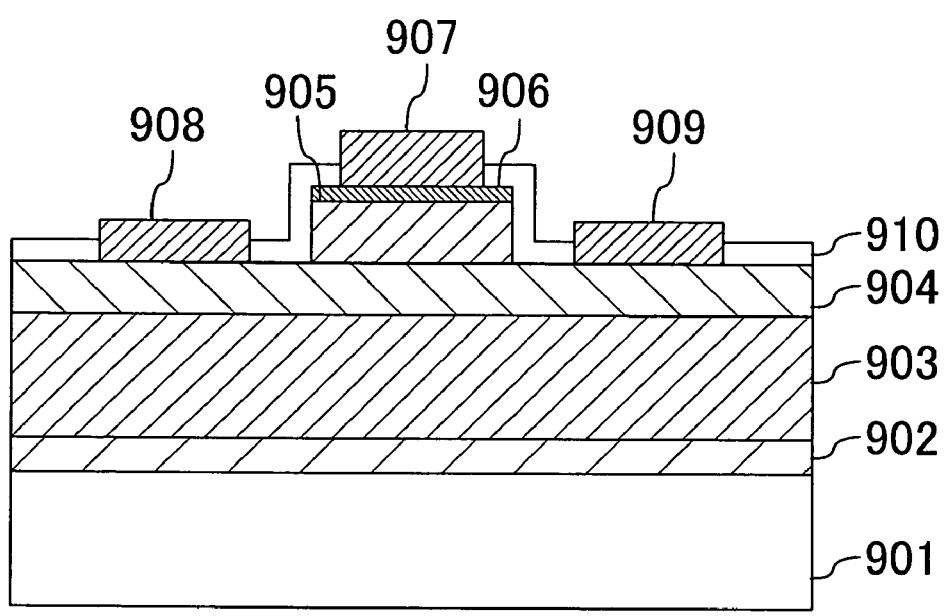
FIG. 11 is a cross-sectional view illustrating a nitride semiconductor device as a comparative example.

FIG. 6 shows a relationship between the thickness of the first semiconductor layer 504 and the switching speed in a transistor as an example of the nitride semiconductor device of this embodiment.

As shown in FIG. 6, as the thickness of the first semiconductor layer 504 increases, the switching speed decreases.

As described above, the nitride semiconductor device of this embodiment has a structure in which the underlying layer 503 made of semiconductor having a potential barrier in the valence band with respect to the first semiconductor layer 504 forming the channel layer is provided and the thickness of the first semiconductor layer 504 is set at an appropriate value, so that switching is performed at high speed. Accordingly, a normally-OFF nitride semiconductor transistor exhibiting large operation current, small leakage current and high switching speed is implemented.

As described above, a nitride semiconductor device according to the present invention is useful as, for example, a normally-OFF nitride semiconductor device exhibiting large operation current and high switching speed.

What is claimed is:

1. A nitride semiconductor device, comprising:
    a first semiconductor layer made of first nitride semiconductor;
    a second semiconductor layer formed on a principal surface of the first semiconductor layer and made of second nitride semiconductor having a bandgap wider than that of the first nitride semiconductor, said second nitride semiconductor includes $Al_xM_{1-x}$, where M is at least one of the group III elements except Al, and an $Al_x$ content of $0<x<0.25$;
    a control layer selectively formed on an upper portion of the second semiconductor layer and made of third nitride semiconductor having a p-type conductivity;
    source and drain electrodes formed on the second semiconductor layer at respective sides of the control layer; and
    a fourth semiconductor layer formed on a surface of the first semiconductor layer opposite to the principal surface, having a potential barrier in a valence band with respect to the first nitride semiconductor and made of fourth nitride semiconductor containing aluminum,
    wherein:
    a the channel region is formed in the first semiconductor layer,
    the control layer controls electrical conductivity between the source electrode and the drain electrode,
    the nitride semiconductor device is of a normally OFF type, and
    a thickness of the control layer is greater than a thickness of the second semiconductor layer.

2. The nitride semiconductor device of claim 1, wherein the first nitride semiconductor contains indium.

3. The nitride semiconductor device of claim 1, wherein the first semiconductor layer has a thickness larger than 0 nm and equal to or smaller than 30 nm.

4. The nitride semiconductor device of claim 3, wherein the fourth semiconductor layer is formed so that the holes injected into the channel region can increase in the first semiconductor layer without dissipation.

5. The nitride semiconductor device of claim 1, wherein the first nitride semiconductor contains indium, and the first semiconductor layer has a thickness larger than 0 nm and equal to or smaller than 30 nm.

6. The nitride semiconductor device of claim 1, wherein the distance between the control layer and the drain electrode is about 5 μm or more.

7. The nitride semiconductor device of claim 1, wherein
    the control layer has a different Al content from the second semiconductor layer, and
    the control layer is made of p-type GaN.

8. The nitride semiconductor device of claim 1, further comprising a contact layer formed directly on the control layer and made of fifth nitride semiconductor having a p-type impurity concentration higher than that of the control layer; and
    a gate electrode formed directly on the contact layer,
    wherein the gate electrode is in Ohmic contact with the contact layer.

9. The nitride semiconductor device of claim 1, wherein the second semiconductor layer includes $Al_xGa_{1-x}$.

* * * * *